(12) United States Patent
Hongo et al.

(10) Patent No.: US 6,716,330 B2
(45) Date of Patent: Apr. 6, 2004

(54) ELECTROLESS PLATING APPARATUS AND METHOD

(75) Inventors: Akihisa Hongo, Yokohama (JP); Koji Mishima, Fujisawa (JP); Hiroaki Inoue, Tokyo (JP); Norio Kimura, Fujisawa (JP); Tsutomu Karimata, Yokohama (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/983,399

(22) Filed: Oct. 24, 2001

(65) Prior Publication Data
US 2002/0127790 A1 Sep. 12, 2002

(30) Foreign Application Priority Data

Oct. 26, 2000 (JP) .......................... 2000-327800
Dec. 11, 2000 (JP) .......................... 2000-376189

(51) Int. Cl.⁷ .............................................. C25D 21/12
(52) U.S. Cl. ............................................ 205/81; 204/232
(58) Field of Search .............................. 204/232, 252, 204/237–238, 263, 269; 205/81–82; 118/417, 429

(56) References Cited

U.S. PATENT DOCUMENTS

| 4,109,612 A | * | 8/1978 | Mayer ......................... 118/417 |
| 5,357,991 A | | 10/1994 | Bergman et al. |
| 5,938,845 A | * | 8/1999 | Ang ............................ 118/429 |
| 6,267,853 B1 | * | 7/2001 | Dordi et al. ................. 204/232 |
| 6,379,520 B1 | * | 4/2002 | Kuriyama et al. ............ 205/81 |

FOREIGN PATENT DOCUMENTS

| EP | 1 029 954 | 8/2000 |
| JP | 11-87273 | 3/1999 |
| JP | 2000-256896 | 9/2000 |

* cited by examiner

*Primary Examiner*—David Nelms
*Assistant Examiner*—David Vu
(74) *Attorney, Agent, or Firm*—Wenderoth, Lind & Ponack, L.L.P.

(57) ABSTRACT

An plating apparatus which can easily form a plated film having more uniform thickness on a surface, to be plate, of a material to be plated. The plating apparatus includes a holding portion having a heating portion for holding a material to be plated in such a state that a surface to be plated faces downward, and a plating bath for introducing an electroless plating liquid having a predetermined temperature into a plating chamber, and holding the electroless plating liquid while allowing the electroless plating liquid to overflow an overflow dam. The material which is by the holding portion, is brought into contact with the plating liquid in the plating bath to plate the material.

5 Claims, 8 Drawing Sheets

ELECTROLESS PLATING APPARATUS AND METHOD

BACKGROUND OF THE INVENTION

1. Field of the Invention

The present invention relates to an electroless plating apparatus and method which are preferably used for forming interconnects on a semiconductor substrate (including filling of a metal such as copper into an interconnection groove or the like, forming of a seed layer, and forming of a reinforcing seed layer on a seed layer for the purpose of reinforcing the seed layer), an interconnection-protective film, and a diffusion-preventive film.

2. Description of the Related Art

An electroless plating is such a method that a plated film is formed on a surface of a material to be plated by chemically reducing metal ions in a plating liquid without supplying any electric current from the outside, and electroless plating is widely used in nickel-phosphorus plating and nickel-boron plating for providing corrosion resistance and wear resistance, and copper plating for a printed-wiring substrate.

As an electroless plating apparatus, there has been generally known an apparatus comprising a plating bath for holding an electroless plating liquid while causing the electroless plating liquid to overflow, and a vertically movable holding portion disposed above the plating bath for holding a material, to be plated, such as a substrate so as to face laterally, whereby the material, to be plated, held by the holding portion is dipped into the plating liquid in the plating bath (the so-called dipping(dip)). Further, there has been also generally known an apparatus comprising a holding portion for holding a material, to be plated, such as a substrate so as to face upwardly (face up), and a plating liquid supply portion for supplying a plating liquid to an upper surface (surface to be plate) of the material, to be plated, held by the holding portion, whereby the plating liquid flows along the upper surface of the material, to be plated, held by the holding portion. As a face-up type plating apparatus, there is a coater face-up type plating apparatus in which a plating liquid flows along an upper surface of a material to be plated by supplying the plating liquid to the upper surface of the material to be plated from the plating liquid supply portion and rotating the material to be plated.

In recent years, as the processing speed and integration of a semiconductor chip becomes higher, there has been a growing tendency to replace aluminum or aluminum alloy with copper having a low electric conductivity and a high electromigration resistance as metallic materials for forming interconnection circuits on the semiconductor substrate. This kind of copper interconnect is generally formed by filling copper into fine recesses formed in the surface of the substrate. As a method for forming the copper interconnect, plating is generally used. In any case, after a copper film is deposited on the surface of the substrate, the surface of the substrate is polished to a flat finish by chemical mechanical polishing (CMP).

An electroless plating is applied to main filling materials (Cu) for the copper interconnect, the formation of the seed layer on the barrier metal, or the reinforcement of the seed (Cu), further the formation of the barrier metal itself, or the formation of cap material for the copper interconnect (in any case, Ni—P, Ni—B, Co—P, Ni—W—P, Ni—Co—P, Co—W—P), or the like. In any electroless plating process, uniformity of the film thickness over an entire surface of the substrate is required.

In this case, in the electroless plating, as soon as a material to be plated is brought into contact with a plating liquid, a plating metal begins to be deposited on the surface to be plated, and the deposition velocity of the plating metal varies with the temperature of the plating liquid. Thus, in order to form a plated film having a uniform thickness on the surface of the material to be plated, it is necessary that the temperature of the plating liquid should be uniform on the entire surface to be plated from the time when the plating liquid begins to be brought into contact with the material to be plated, and should be kept constant during all the plating process of this contact, and the velocity distribution (thickness of a diffusion layer or a boundary layer formed along the surface to be plated) of the plating liquid in a direction perpendicular to the surface to be plated during the plating process should be uniform over the entire surface to be plated.

However, in the conventional dip type and jig fixing type plating, it has been difficult to make a flow of the plating liquid on the substrate uniform. Further, in the coater face-up type plating, there has been problems of a control of flow and a uniformity of liquid temperature.

Figure 11:
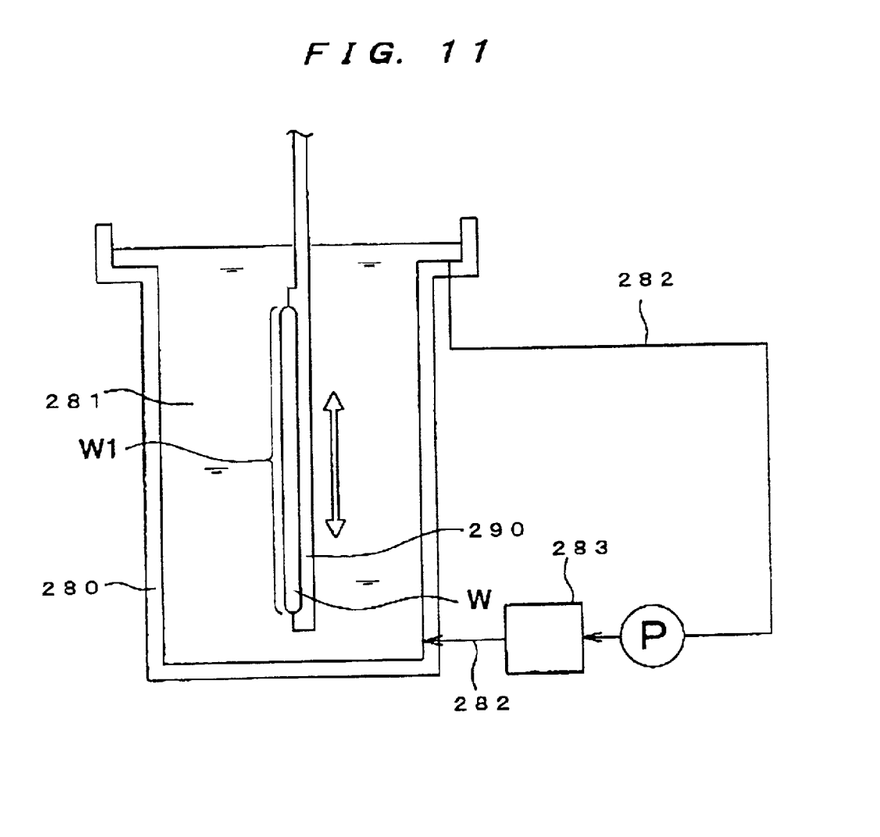
FIG. 11 is a schematic view of a conventional electroless plating apparatus.

FIG. 11 is a schematic view showing a conventional dip type electroless plating apparatus. As shown in FIG. 11, this electroless plating apparatus comprises a plating bath 280 for storing a plating liquid 281 therein, and a substrate holding apparatus (substrate holding means) 290 for holding a semiconductor substrate W.

In the electroless plating, a good reaction cannot take place unless the temperature at the contacting portion between a surface W1, to be plated, of a semiconductor substrate W and a plating liquid is kept at a predetermined temperature (for example, 60° C.). Therefore, in order to heat the plating liquid 281 in the plating bath 280 and keep the plating liquid 281 at a predetermined constant temperature, a pipe 282 is connected to the plating bath 280 to withdraw the plating liquid in the plating bath 280 and to circulate the plating liquid by a pump P, and there is provided a heating apparatus (heating means) 283, in the pipe 282, such as a heater for heating the plating liquid to a predetermined temperature.

On the other hand, the substrate holding apparatus 290 is formed into such a shape that the substrate holding apparatus 290 covers the surface of the semiconductor substrate except for the surface W1, to be plated, of the semiconductor substrate W, and is adapted to dip the semiconductor substrate W into the plating bath 280 in such a state the surface W1 to be plated is placed in a vertical direction. The reason for placing the surface W1, to be plated, of the semiconductor W in a vertical direction in the plating bath 280 is that gas is generated on the surface W1 to be plated by a plating reaction, and if the generated gas remains on a certain area of the surface W1 to be plated, the plating reaction is obstructed at such area, and hence such generated gas is required to be easily separated from the surface W1 to be plated.

However, in the above conventional electroless plating apparatus, because the surface W1, to be plated, of the semiconductor substrate W must be placed vertically in the plating bath 280, the plating bath 280 is required to have a large depth, and thus cannot be downsized. Further, because it is necessary to provide the heating apparatus 283 outside the plating bath 280, an overall apparatus cannot be downsized also in this respect.

On the other hand, in the case where a copper plating is applied to the semiconductor substrate W, when the temperature of the plating liquid varies by 1° C. in a plating time of one minute at, for example, around 60° C., the difference of the film thickness amounts to approximately 1.8 nm, and hence an extremely precise temperature control of the plating liquid is required. However, as described above, the plating bath 280 cannot be downsized, and thus a large amount of the plating liquid is required to be contained. Consequently, the temperature of the plating liquid cannot be precisely controlled, and the amount of the plating liquid to be used increases to thus increase electric power consumption for heating the plating liquid and keeping the plating liquid warm.

SUMMARY OF THE INVENTION

The present invention has been made in view of the above drawbacks. It is therefore a first object of the present invention to provide an electroless plating apparatus which can easily form a plated film having more uniform thickness on a surface, to be plate, of a material to be plated.

A second object of the present invention is to provide electroless plating apparatus and method in which an overall apparatus can be downsized, the amount of a plating liquid to be used can be small, and the temperature of the plating liquid can be precisely controlled.

In order to achieve the first object, according to a first aspect of the present invention, there is provided an electroless plating apparatus comprising; a holding portion having a heating portion for holding a material to be plated in such a state that a surface to be plated faces downward; and a plating bath for introducing an electroless plating liquid having a predetermined temperature into a plating chamber, and holding the electroless plating liquid while allowing the electroless plating liquid to overflow an overflow dam; wherein the material, to be plated, held by the holding portion is brought into contact with the plating liquid in the plating bath to plate the material. The electroless plating liquid is preferably introduced into the plating bath by an upward flow.

In this case, the heating portion may be attached to the holding portion or may be integrally provided in the holding portion. The built-in heating portion is preferable because heat can be effectively and uniformly transferred.

With this arrangement, while holding the material, to be plated, by the holding portion and heating the material, to be plated, to the same temperature as that of the plating liquid by the heating portion provided in the holding portion, the material to be plated is dipped in the plating liquid having a predetermined temperature to perform a plating treatment, thereby preventing the surface of the material, to be plated, from becoming nonuniform temperature distribution and preventing the plating temperature from being changed during a plating process. Further, by creating a stable flow of the plating liquid flowing upwardly and spreading outwardly in the plating chamber, the velocity distribution (thickness of a diffusion layer or a boundary layer) of the plating liquid in a direction perpendicular to the surface of the material to be plated can be more uniform over an entire area of the surface to be plated during the plating process.

The temperature of the plating liquid to be introduced into the plating bath is in the range of, for example, 25 to 90° C., preferably 55 to about 80° C., and the flow rate of the plating liquid is in the range of, for example, 1 to 30 l (liter)/min, preferably 1 to 20 l/min, and more preferably 1 to about 10 l/min. However, the optimal flow rate of the plating liquid varies with process temperature and reducing reaction state.

According to a preferable aspect of the present invention, the holding portion is adapted to be freely rotatable. With this arrangement, by holding and rotating the material to be plated by the holding portion, the velocity distribution of the plating liquid in a direction perpendicular to the surface, to be plated, of the material during a plating process can be more uniform. This rotational speed is in the range of, for example, 0 to 100 rpm (0 to 100 min$^{-1}$), preferably 0 to about 50 rpm (0 to 50 min$^{-1}$). However, these optimal rotational speeds vary with reducing reaction state and required uniformity of the film thickness on the surface.

According to a preferable aspect of the present invention, at least an area of a bottom surface of the plating chamber which faces the material, to be plated, held by the holding portion has a quadratic curved surface spreading upwardly and outwardly.

With this arrangement, in the area having a quadratic curve on the bottom surface of the plating chamber, the plating liquid flows smoothly in a laminar flow along the bottom surface of the plating chamber without generating vortex locally while flowing.

According to a preferable aspect of the present invention, a heating portion for heating the plating liquid held by the plating bath or a heat insulating material for heat insulation of the plating liquid from the outside is provided in the plating bath. Thus, the plating liquid having, for example, a high temperature can be prevented from being gradually cooled while flowing in the plating bath.

According to a preferable aspect of the present invention, the holding portion is adapted to hold the substrate by a vacuum chuck or an electrostatic chuck.

In the case where a uniform flow of the plating liquid on the substrate is considered to be formed, the seal located at the outer peripheral portion of the substrate becomes a factor to disturb the flow of the plating liquid. In order to further improve accuracy of uniformity of the surface, it is desirable that there is no seal on the surface, to be plated, of the substrate. Thus, the chuck should hold the backside of the substrate, the vacuum chuck or the electrostatic chuck should be used, and the seal should be performed at the outer periphery of the backside of the substrate.

According to an aspect of a substrate processing apparatus of the present invention, the substrate processing apparatus comprises the electroless plating apparatus for forming a plated film on a surface of the substrate, and an apparatus for forming a catalyst layer before applying electroless plating to the surface of the substrate by the electroless plating apparatus.

In order to achieve the above second object, according to a second aspect of the present invention, there is provided an electroless plating method comprising: facing a surface, to be plated, of a substrate downwardly; and processing the surface to be plated by bringing the surface to be plated into contact with an electroless plating treatment liquid.

With this arrangement, the surface to be plated can be easily brought into contact with the plating treatment liquid. Further, the amount of the plating treatment liquid to be used can be reduced and the temperature of the plating liquid can be accurately and easily controlled, and the electric power consumption for heating the plating treatment liquid and keeping the plating treatment liquid warm can be decreased.

In this case, by bringing the surface to be plated into contact with the electroless plating treatment liquid in such a state that the surface to be plated is inclined, gas generated on the surface to be plated can be effectively removed from the surface to be plated.

Further, gas generated on the surface to be plated is removed from the surface to be plated by forming a flow of the electroless plating treatment liquid in a certain direction on the surface to be plated and entraining the gas generated on the surface to be plated with the flow of the electroless plating liquid.

According to a second aspect of the present invention, there is provided an electroless plating apparatus, comprising: a plating treatment liquid holding apparatus for storing a plating treatment liquid while maintaining the plating treatment liquid at a predetermined plating treatment temperature; and a substrate holding apparatus for holding a substrate in such a state that a surface, to be plated, of the substrate faces downwardly, and bringing the surface, to be plated, of the substrate into contact with the plating treatment liquid.

With this arrangement, the plating treatment liquid holding apparatus can be downsized, and an overall apparatus can be downsized.

The plating treatment liquid holding apparatus preferably has a heater at a bottom surface of the plating treatment liquid holding apparatus, and a dam for holding the plating treatment liquid over a periphery of the heater.

DETAILED DESCRIPTION OF THE PREFERRED EMBODIMENTS

Embodiments of the present invention will be described below with reference to drawings. In the following examples, the following cases will be described: An electroless copper plating is applied to a surface of a substrate, such as a semiconductor wafer, in which a via hole or a trench for an interconnect is formed, thereby filling copper into the via hole or the trench for the interconnect, and then a CMP process is applied to the surface of the substrate to polish the surface of the substrate, thus forming a copper interconnect on the surface of the substrate.

An example of this plating process will be described with reference to FIGS. 1A through 1C.

Figure 1A:
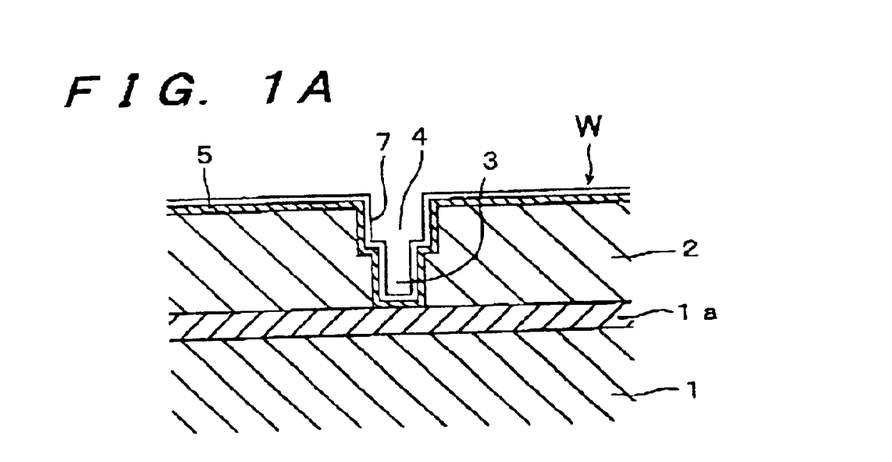
FIG. 1A through FIG. 1C are views showing an example of a plating process.
Figure 1B:
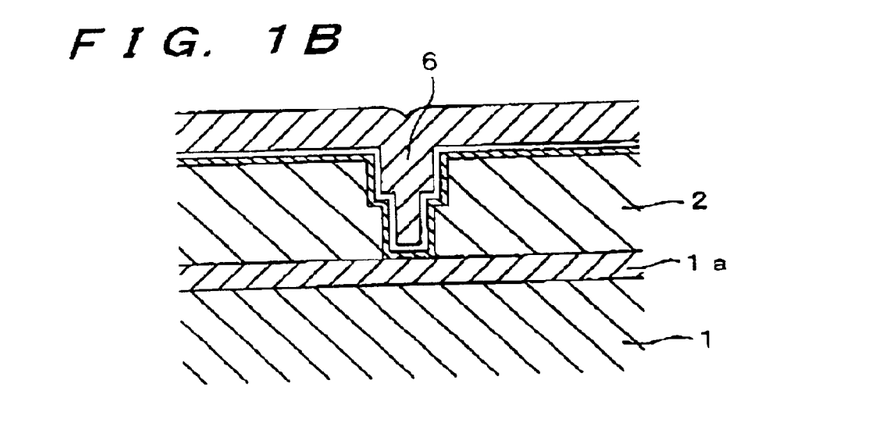
Figure 1C:
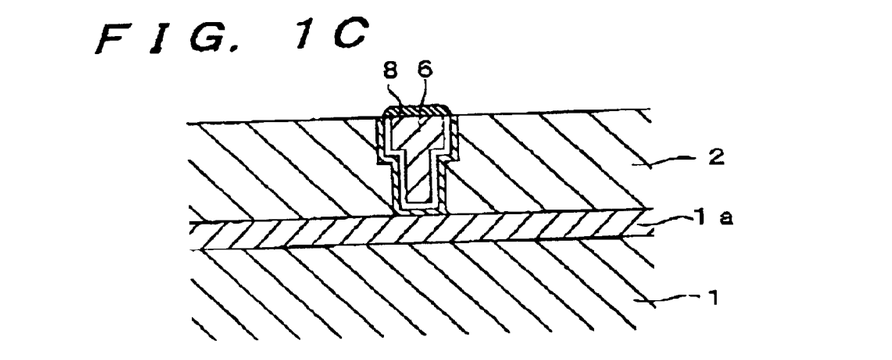

As shown in FIG. 1A, an insulating film 2 of $Sio_2$ is deposited on a conductive layer 1a of a substrate 1 on which semiconductor devices are formed, and a via hole 3 and a trench 4 for an interconnect are formed by lithography and etching technology. Thereafter, a barrier layer 5 of TiN or the like is formed thereon, and then a seed layer 7 is formed on the barrier layer 5 by electroless copper plating. In some cases, the seed layer 7 is formed in advance by sputtering, and a reinforcing seed layer is formed by the copper electroless plating on the seed layer 7 for reinforcing the seed layer. Further, as shown in FIG. 1B, copper plating is applied to a surface of the semiconductor substrate W to fill the via hole 3 and the trench 4 with copper and to deposit a copper layer 6 on the insulating film 2. Thereafter, the copper layer 6 on the insulating film 2 is removed by chemical mechanical polishing (CMP) to make the surface of the copper layer 6 filled into the via hole 3 and the trench 4 for the interconnect lie substantially flush with the surface of the insulating film 2, and then an interconnection-protective film 8 is formed on an exposed metal surface.

Figure 2:
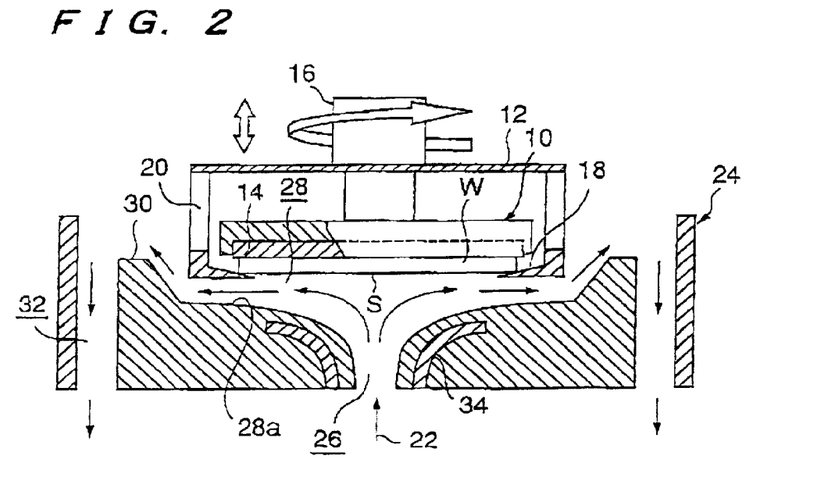
FIG. 2 is a cross-sectional view showing an electroless plating apparatus according to a first embodiment of a first aspect of the present invention.

FIG. 2 shows an electroless plating apparatus according to a first embodiment of the present invention. This electroless plating apparatus has a substrate holding portion 10 for holding a substrate W (material to be plated), such as a semiconductor wafer, having a surface S (surface to be plated) in which a via hole or a trench for an interconnect is formed, in such a manner that the surface S faces downward (facedown). The substrate holding portion 10 is housed in a housing 12 so as to be movable vertically, and rotatable in unison with the housing 12 which is open downwardly. By using the electroless plating apparatus shown in FIG. 2, the seed layer 7 shown in FIG. 1A can be formed by copper plating, copper alloy plating, or cobalt alloy plating, the seed layer 7 can be reinforced by copper plating, the copper layer 6 shown in FIG. 1B can be formed by copper plating, and the interconnection-protective film 8 shown in FIG. 1C can be formed by cobalt alloy plating, nickel alloy plating, or copper alloy plating. A copper plating liquid used in copper plating comprises a copper sulfate liquid to which a reducing agent such as sodium hypophosphite or glyoxylic acid, a complexing agent, a pH buffer agent, a pH regulating agent, and the like are added. A nickel plating liquid used in the nickel alloy plating comprises nickel chloride or nickel sulfate to which sodium hypophosphite as a reducing agent in the case for Ni—P film, sodium borohydride as a reducing agent in the case for Ni—B film, and other agents, such as a complexing agent and a pH buffer agent are added.

Inside the substrate holding portion 10, there is provided a heating portion (heater) 14 for heating the substrate W over an area slightly larger than an entire area of the surface S of the substrate W in such a state that the lower surface of the heating portion 14 is exposed, and the substrate W is held on the lower surface of the heating potion 14 such that the substrate W is held by a seal 18. Thus, the substrate W is held by the lower surface of the heating portion 14 and heated by the heating portion 14 so as not to become nonuniform with regard to temperature distribution on the substrate W. In addition, the heating portion 14 has a temperature controlling function so that the substrate W can be heated to a desired temperature.

The housing 12 is connected to a lower end of a main shaft 16 which is vertically movable and rotatable, and has a lower end which projects inwardly and forms a seal claw 18 for sealing an outer peripheral portion of the substrate W, and a circumferential wall having an opening 20 for allowing the substrate W to be carried in or out.

A plating bath 24 for holding an electroless plating liquid 22 is disposed below the housing 12. In order to reduce friction against the plating liquid 22, the plating bath 24 is made of, for example, TEFLON (polytetrafluoroethylene), and has a plating chamber 28 therein which holds the plating liquid 22 and communicates with a plating liquid supply passage 26 extending upwardly from a central bottom portion of the plating bath 24. The periphery of the plating chamber 28 is surrounded by an overflow dam 30, and a plating liquid discharge passage 32 is formed outwardly of the overflow dam 30. Thus, the plating liquid 22 flows upwardly through the plating liquid supply passage 26 and is introduced into the plating chamber 28, overflows the overflow dam 30, and is then discharged through the plating liquid discharge passage 32 to the outside.

In this case, at least an area of the bottom surface 28a of the plating chamber 28 which faces the substrate W held by the substrate holding portion 10 is streamlined, for example, trumpet-funnel-shaped, and has a quadratic curved surface spreading upwardly and outwardly. In this manner, in the area having a quadratic curve on the bottom surface 28a of the plating chamber 28, the plating liquid 22 flows smoothly in a laminar flow along the bottom surface 28a of the plating chamber 28 without generating vortex locally while flowing.

Further, a heating portion 34 having such a shape as to be along the quadratic curved surface of the bottom surface 28a is embedded at a location close to the bottom surface 28a of the plating chamber 28 within the plating bath 24. Thus, even if the plating liquid 22 which has been heated and is introduced through the plating liquid supply passage 26 into the plating chamber 28 is cooled during conveyance, the plating liquid 22 is heated to a fixed temperature by the heating portion 34. A heat insulating material may be provided instead of the heating portion 34. Further, the heating portion or the heat insulating material may be omitted, if the temperature of the plating liquid is not so high.

In the electroless plating apparatus according to this embodiment, the substrate W is first introduced through the opening 20 into the housing 12, the substrate holding portion 10 is lowered in such a state that the substrate W is placed on and held by the seal claw 18, and hence the substrate W is pressed and held by the substrate holding portion 10. In such a state, the entire area of the substrate W is heated to the same fixed temperature as that of the plating liquid 22 to be introduced into the plating chamber 28 by the heating portion 14 incorporated in the substrate holding portion 10.

On the other hand, the plating liquid 22 heated to a fixed temperature is introduced through the plating liquid supply passage 26 into the plating chamber 28, and is caused to overflow the overflow dam 30. The temperature of the plating liquid 22 to be introduced into the plating bath 24 is in the range of, for example, 25 to 90° C., preferably 55 to about 80° C., and the flow rate of the plating liquid 22 is in the range of, for example, 1 to 30 l(liter)/min, preferably 1 to 20 l/min, and more preferably 1 to about 10 l/min.

In such a state, the substrate W is lowered while it is rotated at a rotational speed of, for example, 0 to 100 rpm (0 to 100 min$^{-1}$), preferably 0 to 50 rpm (0 to 50 min$^{-1}$), more preferably 0 to about 20 rpm (0 to 20 min$^{-1}$), whereby the substrate W is dipped in the plating liquid 22 in the plating chamber 28 to apply copper plating to a surface of the substrate W. Optimal values of the temperature and the flow rate of the plating liquid, and the rotational speed of the substrate vary with respective processes.

In this manner, while holding the substrate W by the substrate holding portion 10 and heating the substrate W to the same temperature as that of the plating liquid 22 by the heating portion 14 provided in the substrate holding portion 10, the substrate W is dipped in the plating liquid having a predetermined temperature to perform a plating process, thereby preventing the surface S of the substrate W from having a nonuniform temperature distribution and preventing the plating temperature from being changed during the plating process.

Further, by creating a stable flow of the plating liquid 22 flowing upwardly and spreading outwardly in the plating chamber 28, the velocity distribution (thickness of a diffusion layer or a boundary layer) of the plating liquid 22 in a direction perpendicular to the surface S of the substrate W can be more uniform over an entire area of the surface S during the plating process. Thus, it is possible to deposit a plated copper film having a uniform thickness so as not to cause problems in a subsequent CMP process or a lithography process. Further, for the purpose of formation of a seed layer, it is possible to form the seed layer having a uniform thickness, and hence to stabilize embeddability in a subsequent process.

Figure 5:
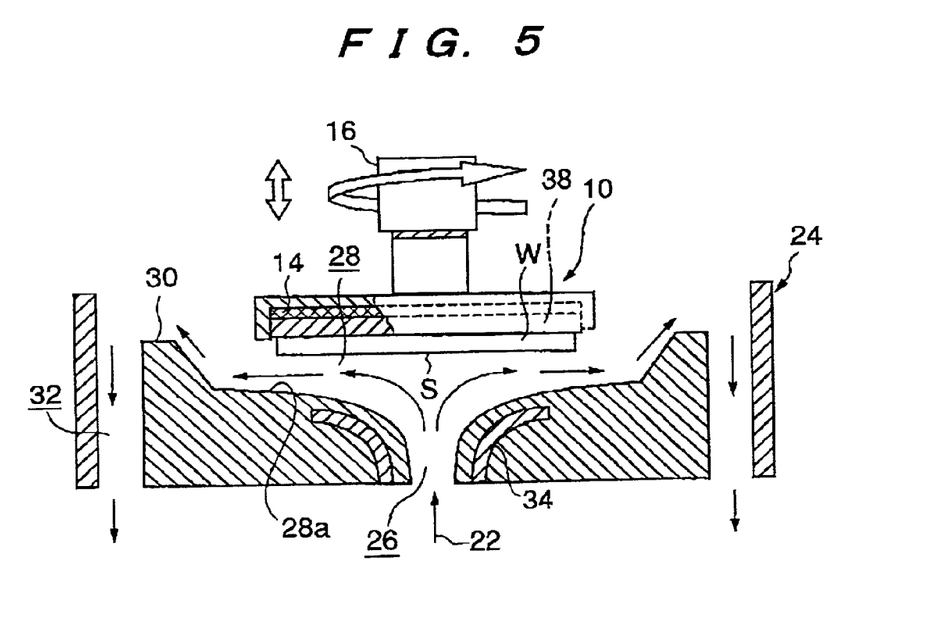
FIG. 5 is a cross-sectional view showing a modified example of the electroless plating apparatus shown in FIG. 2.

After a plating process of a predetermined time finishes, the substrate W is raised, and the liquid is removed from the substrate W, if necessary. Thereafter, the substrate W which has been plated is transferred to the outside of the housing 12 in the reverse operations of the above operations. If the seal claw on the substrate disturbs the flow of the plating liquid and a uniform thickness of the film cannot be maintained, a vacuum chuck or an electrostatic chuck 38 is attached to the lower surface of the substrate holding portion 10 as shown in FIG. 5. In this case, the substrate W is attracted and held by the vacuum chuck or the electrostatic chuck 38, and the seal is attached at the side of the backside surface of the substrate W for sealing this side. Thus, the seal claw can be omitted.

Figure 3:
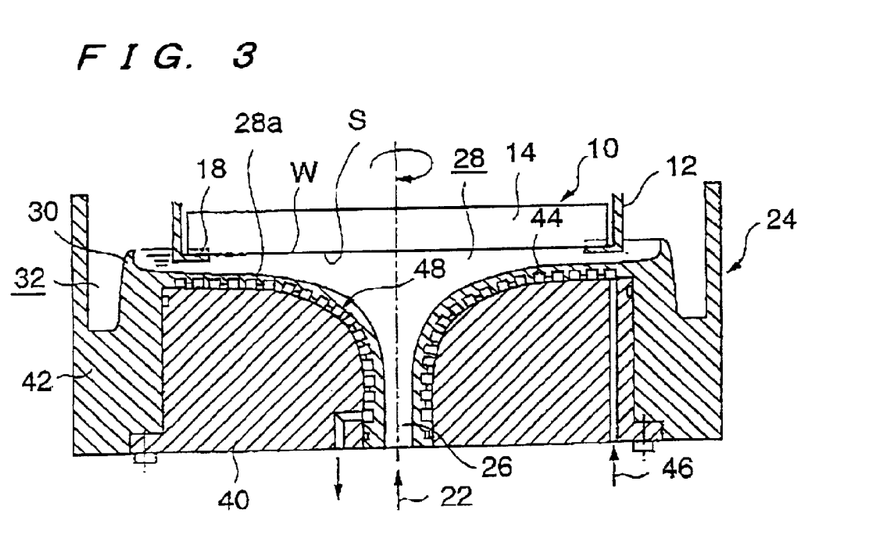
FIG. 3 is a cross-sectional view showing an electroless plating apparatus according to a second embodiment of a first aspect of the present invention.

FIG. 3 shows an electroless plating apparatus according to a second embodiment of the present invention. In the electroless plating apparatus of the present embodiment, the plating bath 24 has a laminated structure composed of a core member 40 and a cover member 42 for covering the surface of the core member 40, and a pipe 44 is provided between the core member 40 and the cover member 42 and a heating medium 46 is introduced into the pipe 44, thereby constituting a heating portion 48 having a jacket structure. In this example, the heating medium 46 is introduced into the pipe 44 from the outside of the plating bath 24 and flows through the pipe 44 toward the interior of the plating bath 24. Other constitutions are substantially the same as those shown in FIG. 2.

According to this embodiment, as the plating liquid 22 flows outwardly in the plating chamber 28, the plating liquid 22 is gradually cooled. By effectively heating the plating liquid 22, which has been cooled most, with the heating medium 46, the temperature of the plating liquid 22 can be more constant.

Figure 4:
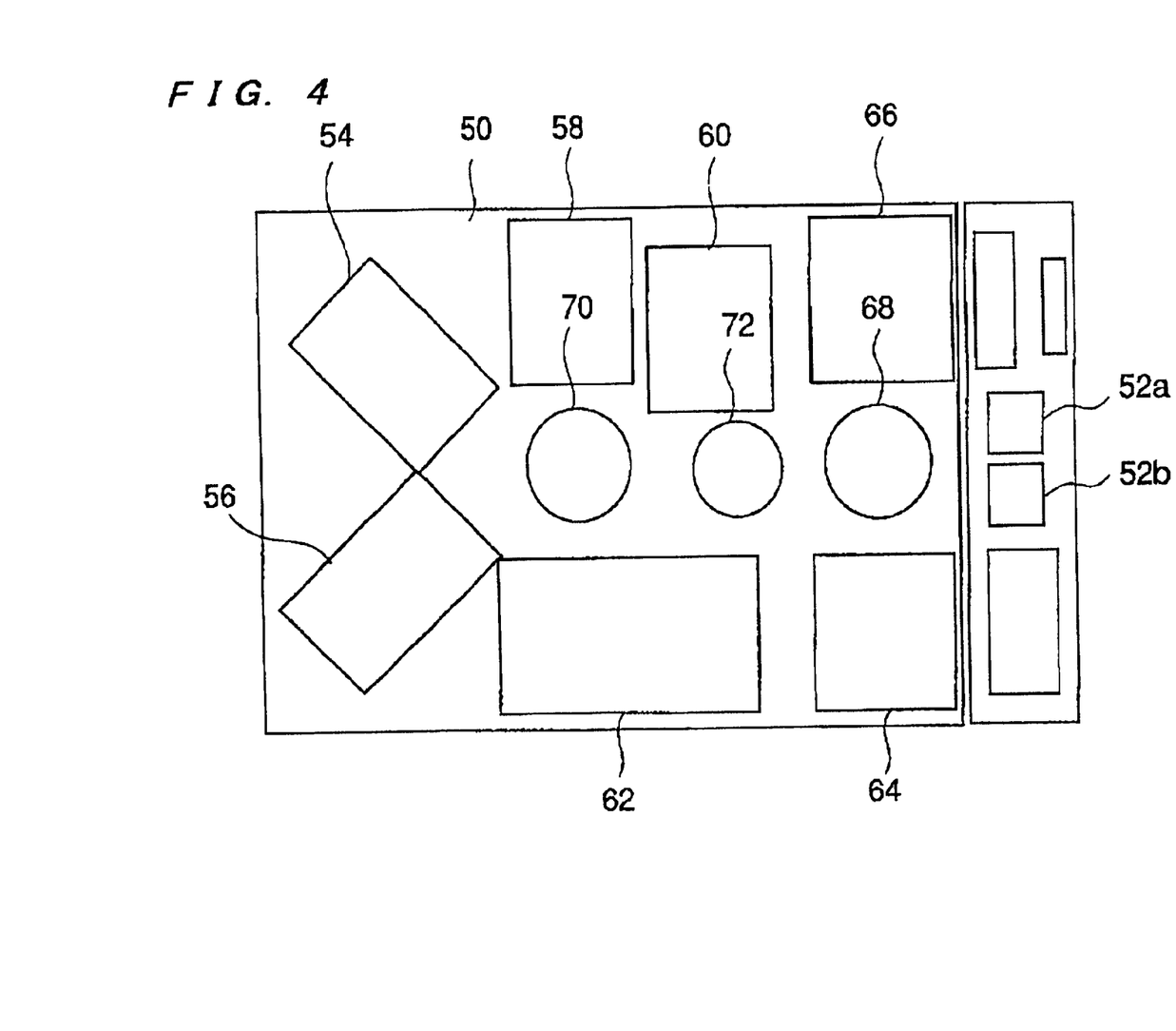
FIG. 4 is a plan view showing a layout of a substrate processing apparatus having the electroless plating apparatus shown in FIG. 2.

FIG. 4 shows a whole structure of the substrate processing apparatus having the electroless plating apparatus shown in FIGS. 2 and 3. The substrate processing apparatus is placed on a rectangular installation floor 50, and comprises load and unload units 52a, 52b, cleaning apparatuses 54, 56 for pretreatment, an activation treatment apparatus 58 for performing an activation treatment using $SnCl_2$ liquid or the like serving as an activating agent in plating, a catalyst imparting apparatus 60 for performing a catalyst imparting treatment, i.e., a Pd imparting treatment using $PdCl_2$ liquid or the like serving as catalyst in electroless plating, and an electroless plating apparatus 62. Further, the substrate processing apparatus comprises cleaning and drying apparatuses 64, 66 for performing a post-treatment after plating, two transfer apparatuses (transfer robots) 68, 70 for transferring the substrate W between the above apparatuses, and a temporary storage stage 72.

Here, in this example, the cleaning and drying apparatus 64 comprises a roll cleaning unit, and the cleaning and drying apparatus 66 comprises a spin dry unit having a pencil-type sponge. The transfer apparatus 68 located at the side of the load and unload units 52a, 52b comprises a dry robot, and the transfer apparatus 70 located at the opposite side of the units 52a, 52b with respect to the temporary storage stage 72 comprises a wet robot having a reversing mechanism. The dry robot transfers dry (dried) substrates W and the wet robot transfers wet (wetted) substrates W.

Next, a series of plating processes by the substrate processing apparatus having the above structure will be described. First, the substrate W held by the load and the unload units 52a, 52b is taken out by the transfer apparatus 68 and placed on the temporary storage stage 72. The substrate W is transferred by the transfer apparatus 70 to the cleaning apparatus 54 where a pre-cleaning is applied to the substrate W, and then the substrate W is transferred to the activation treatment apparatus 58. In the activation treatment apparatus 58, an activation treatment is performed by a treatment liquid containing an activating agent such as $SnCl_2$. Next, the substrate W is transferred to the catalyst imparting apparatus 60 adjacent to the activation treatment apparatus 58. In the catalyst imparting apparatus 60, a catalyst imparting treatment is performed by a catalyst such as $PdCl_2$ liquid or the like, and then the substrate W is rinsed.

During the above processes, in the activation treatment apparatus 58, ions $Sn^{2+}$ generated from the activating agent $SnCl_2$ are adsorbed on the surface of the substrate W, these ions $Sn^{2+}$ are oxidized to $Sn^{4+}$ by $Pd^{2+}$ generated from $PdCl_2$ in the catalyst imparting apparatus 60, and conversely $Pd^{2+}$ is reduced to metal Pd. This metal Pd is deposited on the surface of the substrate W to become a catalyst layer in the subsequent electroless plating process. This process can be performed by using one liquid catalyst of Pd/Sn colloid. Although the above catalyst imparting process can be performed in the activation treatment apparatus 58 and the catalyst imparting apparatus 60 as in this example, this process may be performed by another apparatus, and then the substrate W may be transferred. Further, in some cases, the activation treatment and/or the catalyst imparting treatment may be omitted depending on the material and state of the inner surface of the recess of the semiconductor substrate.

The substrate W is further transferred by the transfer apparatus 70 to the cleaning apparatus 56 where a pre-cleaning is performed, and then the substrate W is transferred to the electroless plating apparatus 62. In the electroless plating apparatus 62, the electroless plating treatment is performed by the use of a predetermined reducing agent and a predetermined plating liquid. In this case, electrons generated by decomposition of the reducing agent at a solid-liquid interface are given through the catalyst on the surface of the substrate to $Cu^{2+}$, thus causing Cu to be deposited on the catalyst as metal Cu and forming a plated copper film. As this catalyst, Fe, Co, Ni, Cu, Ag, and the like which are transition metals can be used other than Pd.

Next, the substrate W which has been plated is taken out from the electroless plating apparatus 62 and transferred to the cleaning and drying apparatus 64 by the transfer apparatus 68. In the cleaning and drying apparatus 64, the substrate W is cleaned with water by a roll, and dried. Then, the substrate is transferred by the transfer apparatus 68 to the cleaning and drying apparatus 66 where a finish cleaning of the substrate is performed by a pencil-type sponge and a spin-dry of the substrate is performed. Thereafter, the substrate is returned to the load and unload units 52a, 52b. The substrate is then transferred to a plating apparatus or an oxide film forming apparatus.

As another example of the treatment processes, a pre-cleaning treatment for imparting catalyst is performed in the cleaning apparatus 54, a catalyst imparting process is performed in the activation treatment apparatus 58, a post-treatment for imparting catalyst is performed in the catalyst imparting apparatus 60, a pre-treatment cleaning before plating is performed in the cleaning apparatus 56, a plating treatment process is performed in the electroless plating apparatus 62, and a cleaning after plating is then performed promptly in the electroless plating apparatus 62 to stop a growth of the plating.

In this example, the plated copper film is formed by the electroless plating. However, as a plated film formed by the electroless plating, besides copper, there are nickel-boron, nickel-phosphorous, cobalt-phosphorous, nickel-tungsten phosphorous, nickel-cobalt-phosphorous, cobalt-tungsten phosphorous, and the like.

As described above, according to the present invention, the surface, to be plated, of the material is prevented from becoming nonuniform temperature distribution and the plating temperature is prevented from being changed during the plating process. Further, the velocity distribution (thickness of a diffusion layer or a boundary layer) of the plating liquid in a direction perpendicular to the surface, to be plated, of the material can be more uniform on the entire area of the surface to be plated, and hence the plated film having a more uniform thickness can be formed on the surface, to be plated, of the material to be plated.

Figure 6:
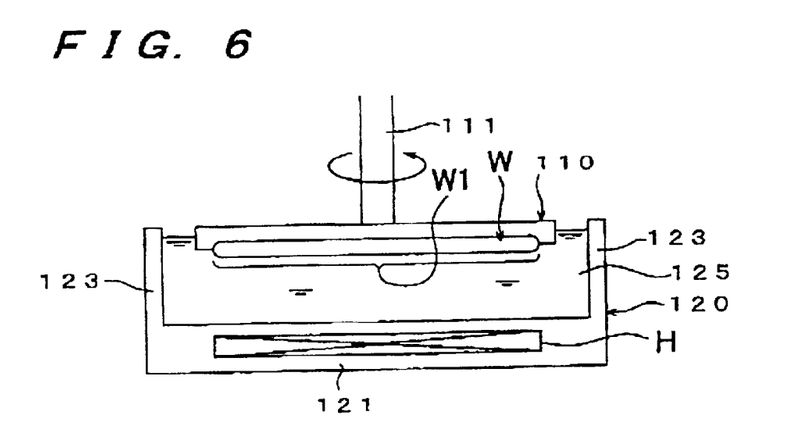
FIG. 6 is a schematic view showing a basic structure of an electroless plating apparatus according to a second aspect of the present invention.

FIG. 6 is a schematic view showing a basic structure of an electroless plating apparatus according to a second aspect of the present invention. As shown in FIG. 6, the electroless plating apparatus comprises a semiconductor substrate W, a substrate holding apparatus (substrate holding means) 110 for holding the semiconductor substrate W, and a plating liquid holding apparatus (plating liquid holding means) 120 for holding a plating liquid (plating treatment liquid) 125. By using the electroless plating apparatus shown in FIG. 6, the seed layer 7 shown in FIG. 1A can be formed by copper plating, copper alloy plating, or cobalt alloy plating, the seed layer 7 can be reinforced by copper plating, the copper layer 6 shown in FIG. 1B can be formed by copper plating, and the interconnection-protective film 8 shown in FIG. 1C can be formed by cobalt alloy plating, nickel alloy plating, or copper alloy plating. A copper plating liquid used in copper plating comprises a copper sulfate liquid to which a reducing agent such as sodium hypophosphite or glyoxylic acid, a completing agent, a pH buffer agent, a pH regulating agent, and the like are added. A nickel plating liquid used in the nickel alloy plating comprises nickel chloride or nickel sulfate to which sodium hypophosphite as a reducing agent in the case for Ni—P film, sodium borohydride as a reducing agent in the case for Ni—B film, and other agents, such as a complexing agent and a pH buffer agent are added.

In this case, the substrate holding apparatus 110 has a structure for holding a semiconductor substrate W such that a surface W1, to be plated, of the substrate W faces just downward (downward). At this time, the surface of the semiconductor substrate W except the surface W1 to be plated is covered with the substrate holding apparatus 110 so as not to cause the plating liquid to be attached to the surface of the semiconductor substrate W except the surface W1 to be plated. A rotation drive shaft 111 for rotatably supporting the substrate holding apparatus 110 is attached to a central upper surface of the substrate holding apparatus 110. The rotation drive shaft 111 is coupled to a rotation drive apparatus (rotation drive means) such as a motor (not shown in the drawing).

On the other hand, the plating liquid holding apparatus 120 comprises a heater holding portion 121 serving as a bottom surface in which a heater H is provided, and a ring-shaped dam 123 extending upwardly from the periphery of the heater holding portion 121 for holding a plating liquid 125.

The electroless plating liquid 125 is filled inside the dam 123 of the plating liquid holding apparatus 120, and is heated by the heater H to a predetermined temperature (electroless plating treatment temperature, for example, 60° C.) optimum for the electroless plating and kept warm at a fixed temperature.

Next, the surface W1, to be plated, of the semiconductor substrate W is held on the lower surface of the substrate holding apparatus 110 in such a state that the surface W1 to be plated faces downwardly, and the surface W1 to be plated is dipped in and brought into contact with the plating liquid 125. At the same time, the substrate holding apparatus 110 is rotated (may not be necessarily rotated). In this manner, a copper plating is applied to the surface W1, to be plated, of the semiconductor substrate W.

As described above, according to the present invention, because the surface W1, to be plated, of the semiconductor substrate W is brought into contact with the plating liquid 125 in such a state that the surface W1 to be plated faces downwardly, the depth of the plating liquid 125 can be small in structure. Thus, the plating liquid 125 should be held in minimum and necessary quantity in the plating liquid holding apparatus 120, and hence the plating liquid holding apparatus 120 can be downsized. Further, since the heater H is provided in the heater holding portion 121, the plating liquid holding apparatus 120 can be smaller than the conventional plating treatment tank 280 shown in FIG. 11. Furthermore, since the amount of the plating liquid to be used is small, the temperature of the plating liquid can be accurately controlled. The electric power consumption for heating the plating liquid can be reduced.

On the other hand, as described above, gas ($H_2$ gas) is normally generated at the time of electroless plating reaction. Therefore, in the basic structure of the electroless plating apparatus shown in FIG. 6, the gas tends to stay at the lower surface of the semiconductor substrate. Even if the substrate holding apparatus 110 is rotated, a part of the gas is collected at a portion of the rotation center located at the central portion of the lower surface of the semiconductor substrate W and is difficult to be removed. Therefore, in order to remove such gas effectively, the following measures were taken by the present inventors.
(Method for Dissolving the Generated Gas into the Plating Liquid)

In this method, composition of the electroless plating liquid is selected to reduce the amount of the gas generated in the electroless plating reaction to such a degree as to allow the generated gas to be dissolved entirely in the plating liquid. In this case, the structure of the electroless plating apparatus may be the same as that shown in FIG. 6.

Gas such as hydrogen gas is dissolved in the plating liquid in a certain solubility. Thus, by reducing the amount of gas generated, the entire amount of the generated gas should be dissolved in the plating liquid for thereby preventing the generated gas from remaining on the surface W1 to be plated.
(Method for Forming a Flow of a Plating Liquid in a Certain Direction so as to Remove the Gas)

Figure 7:
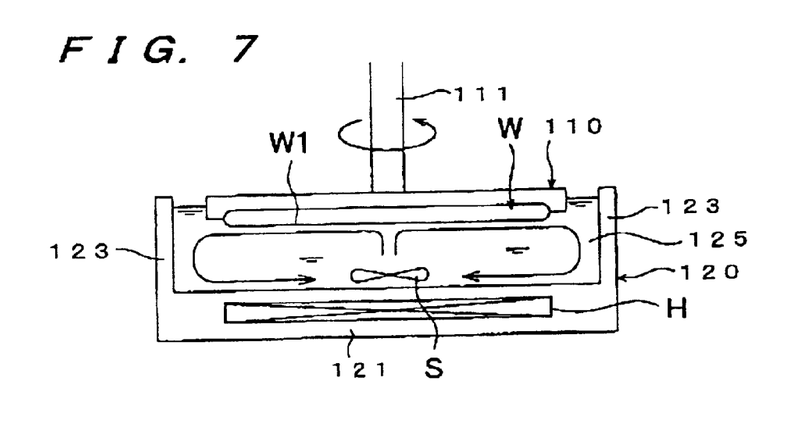
FIG. 7 is a schematic view showing another embodiment of an electroless plating apparatus according to the second aspect of the present invention.

In this method, for example, as shown in FIG. 7, a magnetic stirrer S rotatable by a magnetic force applied from the outside is placed in the vicinity of a bottom surface of the plating liquid 125, and is rotated to create a flow of the plating liquid as shown by arrows in FIG. 7 (flow directed from a central portion of the surface W1 to be plated to an outer periphery of the surface W1 to be plated), whereby the gas generated at the lower surface W1 to be plated is discharged in an outer peripheral direction. As a means for creating a flow of a plating liquid, besides the magnetic stirrer S, a method for rotating an impeller by a motor, a method for injecting the plating liquid from a nozzle, or various other methods are conceivable.
(Method for Bringing the Surface W1 to be Plated into Contact with the Plating Liquid in Such a State that the Surface W1 to be Plated is Inclined)

Figure 8:
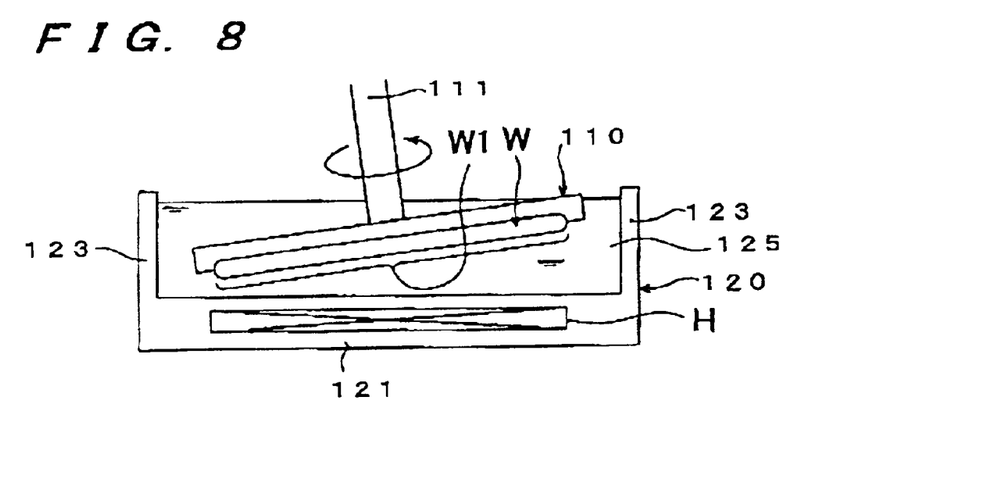
FIG. 8 is a schematic view showing still another embodiment of an electroless plating apparatus according to the second aspect of the present invention.

In this method, for example, as shown in FIG. 8, the surface W1 to be plated is dipped in the plating liquid 125 in such a state that the substrate holding apparatus 110, the semiconductor substrate W held by the substrate holding apparatus 110 and the rotation drive shaft 111 are inclined altogether at a certain angle to horizontal, whereby the gas generated at the lower surface W1 to be plated is caused to ascend along the inclined surface W1 to be plated, and is removed.
(Method for Rotating the Semiconductor Substrate W about a Shaft Other Than a Shaft Perpendicular to the Surface of the Substrate W, While Making the Surface W1 to be Plated be Inclined)

Figure 9:
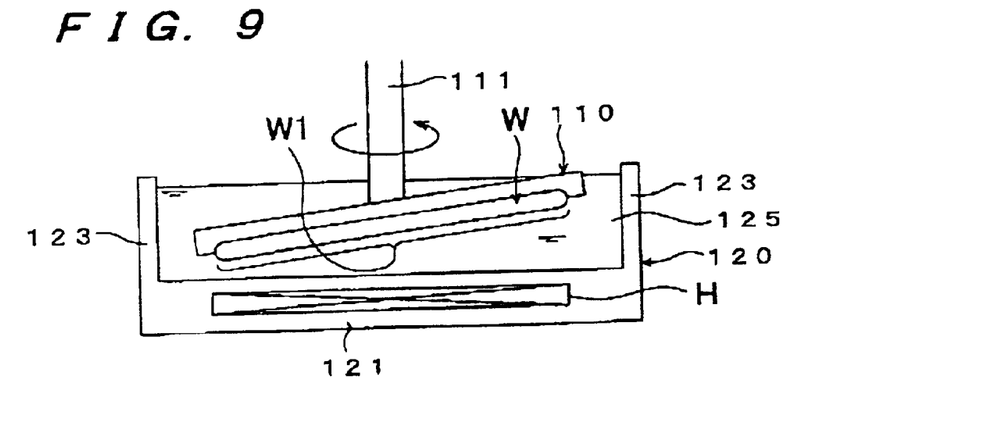
FIG. 9 is a schematic view showing still another embodiment of an electroless plating apparatus according to the second aspect of the present invention.

In this method, for example, as shown in FIG. 9, only the rotation drive shaft 111 is vertically provided in such a state that both the substrate holding apparatus 110 and the semiconductor substrate W held by the substrate holding apparatus 110 are inclined at a predetermined angel to horizontal (namely, the rotation drive shaft 111 is attached so as to be inclined to a plane of the substrate holding apparatus 110), and in this state, the rotation drive shaft 111 is rotated. With this arrangement, the gas generated at the lower surface W1 to be plated can be caused to ascend along the surface W1 to be plated and the plating liquid is stirred by swinging the substrate holding apparatus 110 and the semiconductor substrate W up and down, thereby effectively removing the gas.
(Method for Rotating the Semiconductor Substrate W About a Shaft Other Than a Shaft Perpendicular to the Surface of the Substrate W, While Making the Surface W1 to be Plated be Inclined, and Further Positioning the Rotation Center at a Location Other Than a Center of the Semiconductor Substrate W)

Figure 10:
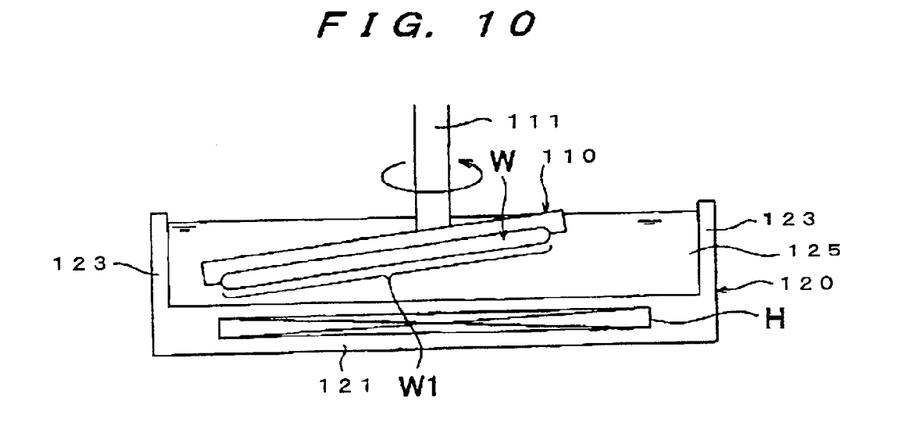
FIG. 10 is a schematic view showing still another embodiment of an electroless plating apparatus according to the second aspect of the present invention.

In this method, for example, as shown in FIG. 10, only the rotation drive shaft 111 is vertically provided in such a state that both the substrate holding apparatus 110 and the semiconductor substrate W held by the substrate holding apparatus 110 are inclined at a predetermined angel to horizontal (namely, the rotation drive shaft 111 is attached so as to be inclined to a plane of the substrate holding apparatus 110), and the rotation drive shaft 111 is attached at the position other than a center of the semiconductor substrate W, and the rotation drive shaft 111 is rotated. With this arrangement, the gas generated at the lower surface W1 to be plated can be caused to ascend along the surface W1 to be plated and the plating liquid is stirred by rotating the substrate holding apparatus 110 and the semiconductor substrate W eccentrically, while swinging the substrate holding apparatus 110 and the semiconductor substrate W up and down, thereby removing the gas more effectively.

Although the embodiments of the present invention have been described with reference to FIGS. 6 through 10, the present invention is not limited to the above embodiments and may be modified within the scope of technical ideas described in the claims, specification and drawings. Further, even if any shape, structure and material are not described directly in the specification and drawings, if they have the same function and effect as the present invention, then they are encompassed within the scope of the technical ideas of the present invention. For example, the electroless plating apparatus according to the present invention is used not only for forming a seed layer or a copper layer for an interconnect, but also for forming an interconnection-protective film and a diffusion-preventive film. Further, the electroless plating apparatus according to the present invention can be used for a pretreatment process of the electroless plating and a catalyst treatment process. Specifically, instead of the electroless plating liquid, by using other electroless plating treatment liquids used for the pretreatment process and the catalyst treatment process, these treatment processes can be performed by this electroless plating apparatus. Further, in the above embodiments, the examples in which the electroless plating is applied to the semiconductor substrate W are described. However, the present invention is applicable to the electroless plating for various substrates other than the semiconductor substrate.

As described above in detail, according to the second aspect of the present invention, the following excellent effects can be obtained.

① Since the surface, to be plated, of the semiconductor substrate can be brought into contact with the plating liquid in such a state that the surface to be plated faces downward, the depth of the plating treatment liquid can be small, and hence the plating treatment liquid holding apparatus for storing the plating treatment liquid can be downsized, and the whole apparatus can be downsized.

② Since the surface, to be plated, of the semiconductor substrate can be brought into contact with the plating liquid in such a state that the surface to be plated faces downwardly, the depth of the plating treatment liquid can be small, and the amount of the plating treatment liquid to be used can be small, and the temperature of the plating treatment liquid can be accurately controlled. In addition, the electric power consumption for heating and retaining warmth can be reduced.

③ Since the surface to be plated is brought into contact with the electroless plating treatment liquid in such a state that the surface to be plated is inclined, the gas generated at the surface to be plated can be easily removed from the surface to be plated.

④ In the case where a flow of the electroless plating treatment liquid is formed in a predetermined direction on the surface to be plated, the gas generated at the surface to be plated can be entrained by the flow of the electroless plating treatment liquid and can be easily removed from the surface to be plated.

⑤ In the case where the heater is provided in the plating treatment liquid holding apparatus itself, the apparatus can be downsized.

What is claimed is:

1. An electroless plating apparatus, comprising:

a holding portion for holding a material to be plated in such a state that a surface of the material to be plated faces downward, said holding portion having a heating portion; and a plating bath for introducing an electroless plating liquid having a predetermined temperature into a plating chamber, and holding the electroless plating liquid while allowing the electroless plating liquid to overflow an overflow dam, wherein the material, to be plated, held by said holding portion is brought into contact with the electroless plating liquid in said plating bath to plate the material, wherein said holding portion is adapted to be rotatable.

2. The electroless plating apparatus according to claim 1, wherein a heating portion for heating the electroless plating liquid held by said plating bath or a heat insulating material for heat insulation of the electroless plating liquid from the outside is provided in said plating bath.

3. The electroless plating apparatus according to claim 1, further comprising an apparatus for forming a catalyst layer before applying electroless plating to the surface of the material by said electroless plating apparatus.

4. An electroless plating apparatus comprising:

a holding portion for holding a material to be plated in such a state that a surface of the material to be plated faces downward, said holding portion having a heating portion; and a plating bath for introducing an electroless plating liquid having a predetermined temperature into a plating chamber, and holding the electroless plating liquid while allowing the electroless plating liquid to overflow an overflow dam, wherein the material, to be plated, held by said holding portion is brought into contact with the electroless plating liquid in said plating bath to plate the material, wherein said holding portion is adapted to hold the material to be plated by a vacuum chuck or an electrostatic chuck.

5. An electroless plating apparatus comprising:

a plating treatment liquid holding apparatus for storing a plating treatment liquid therein while maintaining the plating treatment liquid at a predetermined plating treatment temperature; and a substrate holding apparatus for holding a substrate in such a state that a surface, to be plated, of the substrate faces downwardly, and bringing the surface, to be plated, of the substrate into contact with the plating treatment liquid, wherein said substrate holding apparatus is adapted to be rotatable, and wherein said plating treatment liquid holding apparatus has a heater at a bottom surface of said plating treatment liquid holding apparatus, and a dam for holding the plating treatment liquid over a periphery of said heater.

* * * * *